United States Patent
Kobayashi et al.

(10) Patent No.: US 10,453,957 B2
(45) Date of Patent: Oct. 22, 2019

(54) SEMICONDUCTOR DEVICE

(71) Applicant: KABUSHIKI KAISHA TOSHIBA, Minato-ku, Tokyo (JP)

(72) Inventors: Kenya Kobayashi, Ishikawa (JP); Kenji Maeyama, Ishikawa (JP); Koji Matsuo, Aichi (JP); Yusuke Kawaguchi, Ishikawa (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 26 days.

(21) Appl. No.: 15/449,329

(22) Filed: Mar. 3, 2017

(65) Prior Publication Data

US 2018/0083137 A1    Mar. 22, 2018

(30) Foreign Application Priority Data

Sep. 16, 2016   (JP) .................. 2016-182080

(51) Int. Cl.
*H01L 29/66* (2006.01)
*H01L 29/78* (2006.01)
*H01L 29/423* (2006.01)

(52) U.S. Cl.
CPC ...... *H01L 29/7827* (2013.01); *H01L 29/4236* (2013.01); *H01L 29/66666* (2013.01)

(58) Field of Classification Search
CPC ............ H01L 29/1095; H01L 29/7813; H01L 29/66734; H01L 29/4236; H01L 29/66727;
(Continued)

(56) References Cited

U.S. PATENT DOCUMENTS 6,359,306 B1    3/2002 Ninomiya
6,888,196 B2    5/2005 Kobayashi
(Continued)

FOREIGN PATENT DOCUMENTS

| JP | 2009-043966 A | 2/2009 |
| JP | 2014-038988 A | 2/2014 |
| JP | 2015-179707 A | 10/2015 |

OTHER PUBLICATIONS

Kobayashi et al.: "Sub-micron Cell Pitch 30 V N-channel UMOSFET with Ultra Low On-resistance", Proceedings of the 19th International Symposium on Power Semiconductor Devices & ICs, Jeju, Korea, May 27-30, 2007.

*Primary Examiner* — Meiya Li
(74) *Attorney, Agent, or Firm* — Foley & Lardner LLP

(57) ABSTRACT

A semiconductor device includes a first semiconductor region, a second semiconductor region between a first gate electrode and a second gate electrode that is disposed apart from the first gate electrode in a first direction, third and fourth semiconductor regions provided on respective portions of the second semiconductor region, an insulating region provided between the third semiconductor region and the fourth semiconductor region, and an electrode provided on the third semiconductor region and the fourth semiconductor region and electrically connected to the third semiconductor region and the fourth semiconductor region. The fourth semiconductor region is parallel to the third semiconductor region in a direction intersecting the first direction. The fourth semiconductor region has an impurity concentration higher than that of the second semiconductor region. A lower end of the insulating region is positioned lower than a boundary surface of the second semiconductor region and the third semiconductor region.

4 Claims, 14 Drawing Sheets

(58) Field of Classification Search
CPC ............... H01L 29/456; H01L 29/7811; H01L 29/41766; H01L 21/26586; H01L 29/7397; H01L 29/0623; H01L 29/404; H01L 29/407
See application file for complete search history.

(56) References Cited

U.S. PATENT DOCUMENTS

| | | |
|---|---|---|
| 7,737,490 B2 | 6/2010 | Yoshikawa et al. |
| 8,334,541 B2 | 12/2012 | Miyahara et al. |
| 9,041,100 B2 | 5/2015 | Yoshimochi |
| 9,059,238 B2 | 6/2015 | Kurata et al. |
| 10,243,067 B2 | 3/2019 | Konishi et al. |
| 2005/0032287 A1* | 2/2005 | Nakazawa ........ H01L 29/66727 438/197 |
| 2013/0344667 A1* | 12/2013 | Qin .................... H01L 29/7813 438/270 |
| 2015/0214355 A1 | 7/2015 | Nakano et al. |

* cited by examiner

SEMICONDUCTOR DEVICE

CROSS-REFERENCE TO RELATED APPLICATIONS

This application claims the benefit of and priority to Japanese Patent Application No. 2016-182080, filed on Sep. 16, 2016, the entire contents of which are incorporated herein by reference.

FIELD

Embodiments described herein relate to a semiconductor device and a method for manufacturing a semiconductor device.

BACKGROUND

A semiconductor device such as a MOSFET (Metal Oxide Semiconductor Field Effect Transistor) has a parasitic bipolar transistor (or a parasitic transistor).

SUMMARY

In some embodiments according to one aspect, a semiconductor device including a first semiconductor region of a first conductivity type, a first gate electrode provided on the first semiconductor region via a first gate insulating region, a second gate electrode provided on the first semiconductor region via a second gate insulating region and disposed apart from the first gate electrode in a first direction, a second semiconductor region of a second conductivity type provided between the first gate electrode and the second gate electrode on the first semiconductor region, a third semiconductor region of the first conductivity type provided on a portion of the second semiconductor region, a fourth semiconductor region of the second conductivity type provided on another portion of the second semiconductor, an insulating region provided between the third semiconductor region and the fourth semiconductor region, and a first electrode provided on the third semiconductor region and the fourth semiconductor region. The fourth semiconductor region may be parallel to the third semiconductor region in a second direction intersecting the first direction. The fourth semiconductor region may have an impurity concentration of the second conductivity type higher than an impurity concentration of the second semiconductor region. A lower end of the insulating region may be positioned lower than a boundary surface of the second semiconductor region and the third semiconductor region. The first electrode may be electrically connected to the third semiconductor region and the fourth semiconductor region.

In some embodiments according to one aspect, a semiconductor device including a first semiconductor region of a first conductivity type, a first gate electrode provided on the first semiconductor region via a first gate insulating region, a second gate electrode provided on the first semiconductor region via a second gate insulating region, and disposed apart from the first gate electrode in a first direction, a second semiconductor region of a second conductivity type provided between the first gate electrode and the second gate electrode on the first semiconductor region, a third semiconductor region of the first conductivity type provided on a portion of the second semiconductor region, a fourth semiconductor region of the second conductivity type provide on another portion of the second semiconductor, a metal region provided between the third semiconductor region and the fourth semiconductor region, and a first electrode provided on the third semiconductor region and the fourth semiconductor region. The first electrode may be electrically connected to the third semiconductor region, the fourth semiconductor region and the metal region. The fourth semiconductor region may be parallel to the third semiconductor region in a second direction intersecting the first direction. The fourth semiconductor region may have an impurity concentration of the second conductivity type higher than an impurity concentration of the second semiconductor region. A lower end of the metal region may be positioned lower than a boundary surface of the second semiconductor region and the third semiconductor region.

In some embodiments according to one aspect, a semiconductor device including a first semiconductor region of a first conductivity type, a first gate electrode provided on the first semiconductor region via a first gate insulating region, a second gate electrode provided on the first semiconductor region via a second gate insulating region, and disposed apart from the first gate electrode in a first direction, a second semiconductor region of a second conductivity type provided between the first gate electrode and the second gate electrode on the first semiconductor region, a third semiconductor region of the first conductivity type provided on a portion of the second semiconductor region, a fourth semiconductor region of the second conductivity type provide on another portion of the second semiconductor, a metal region provided on the fourth semiconductor region, an insulating region provided between the third semiconductor region and the metal region, and a first electrode provided on the fourth semiconductor region, the metal region and the insulating region. The first electrode may be electrically connected to the fourth semiconductor region, the metal region and the insulating region. The fourth semiconductor region may have an impurity concentration of the second conductivity type higher than an impurity concentration of the second semiconductor region.

In some embodiments according to one aspect, a method for manufacturing a semiconductor device including a first semiconductor region of a first conductivity type, a first gate electrode provided on the first semiconductor region via a first gate insulating region, a second gate electrode provided on the first semiconductor region via a second gate insulating region and apart from the first gate electrode in a first direction, a second semiconductor region of a second conductivity type provided between the first gate electrode and the second gate electrode on the first semiconductor region, and a third semiconductor region of the first conductivity type provided on the second semiconductor region. According to the method, a first concave portion may be formed by removing the third semiconductor region. A second concave portion may be formed by removing a portion of the second semiconductor region and a portion of the third semiconductor region using a first insulating region and a second insulating region as the mask. A third insulating region may be formed on a side-wall of the first concave portion. A fourth insulating region may be formed on a side-wall of the second concave portion. The fourth semiconductor region may be formed in the second semiconductor region by performing ion implantation through the second concave portion.

Other aspects and embodiments of the disclosure are also encompassed. The foregoing summary and the following detailed description are not meant to restrict the disclosure to any particular embodiment but are merely meant to describe some embodiments of the disclosure.

BRIEF DESCRIPTION OF THE DRAWINGS

FIG. 4 (b) is a cross-sectional view showing a portion of the semiconductor device according to some embodiments.

DETAILED DESCRIPTION

Figure 1:
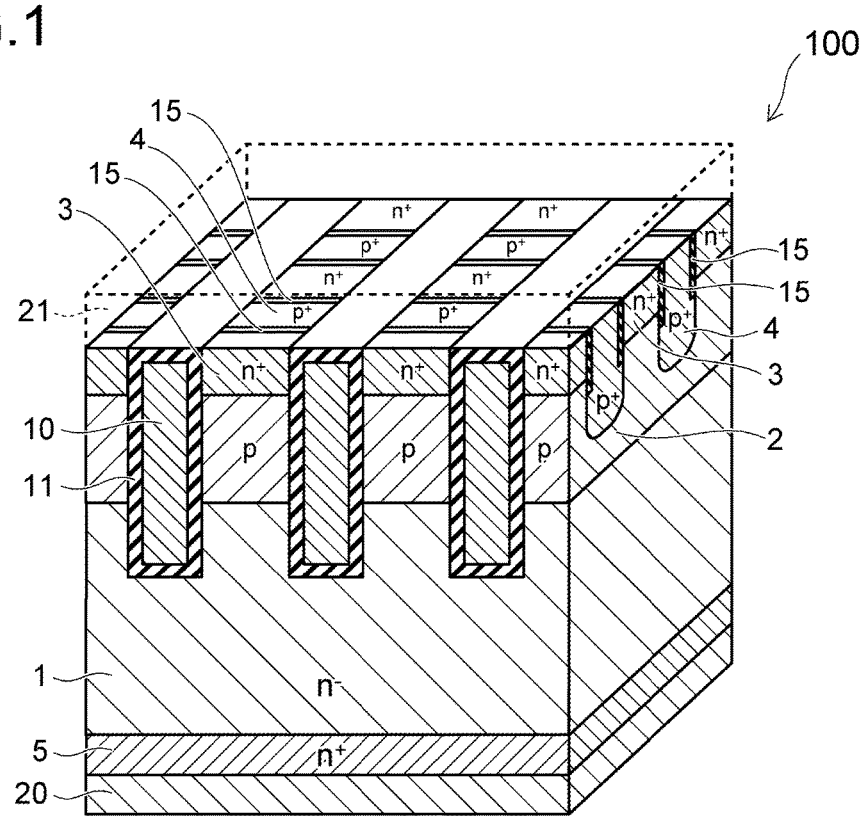
FIG. 1 is a perspective cross-sectional view showing a portion of the semiconductor device according to some embodiments.

Embodiments of the invention will now be described with reference to the drawings.

The drawings are schematic or conceptual, and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described therein above are marked with like reference numerals, and a detailed description is omitted as appropriate.

An XYZ orthogonal coordinate system is used in the description of the embodiments. A Z-direction is defined as the direction from a drain electrode 20 to a source electrode 21 in FIG. 1. An X-direction (a first direction) and a Y-direction (a second direction) are orthogonal to each other. Also both the X-direction and the Y-direction are perpendicular to the Z-direction.

By "parallel" in the description of some embodiments, the term can refer to a relative orientation of precisely 0° as well as a range of variation of less than or equal to ±5° relative to 0°, such as less than or equal to ±4°, less than or equal to ±3°, less than or equal to ±2°, or less than or equal to ±1°. In the description of some embodiments, an element provided "on" another element can encompass cases where the former element is directly on (e.g., in physical contact with) the latter element, as well as cases where one or more intervening elements are located between the former element and the latter element.

In the following description, the notations of $n^+$, $n^-$, $p^+$, p, and $p^-$ indicate relative levels of the impurity concentrations of the conductivity types. Namely, $n^+$ indicates that the n-type impurity concentration is relatively higher than that of $n^-$. $p^+$ indicates that the p-type impurity concentration is relatively higher than that of p; and $p^-$ indicates that the p-type impurity concentration is relatively lower than that of p.

The embodiments described below may be implemented by reversing the p-type and the n-type of the semiconductor regions.

FIG. 1 is a perspective cross-sectional view showing a portion of the semiconductor device 100 according to some embodiments. In FIG. 1, a source electrode 21 is indicated as transparent with a dotted line.

The semiconductor device 100 is, for example, a MOSFET.

In some embodiments, as shown in FIG. 1, the semiconductor device 100 includes a semiconductor region 1 (a first semiconductor region) of the $n^-$-type (a first conductivity type), a base regions 2 (a second semiconductor regions) of the p-type (a second conductivity type), a source region 3 (a third semiconductor region) of the $n^+$-type, a contact region 4 (a fourth semiconductor region) of the $p^+$-type, a drain region 5 of the $n^-$-type, a gate electrode 10, a gate insulating region 11, an insulating regions 15, a drain electrode 20 and a source electrode 21 (a first electrode).

In some embodiments, the drain electrode 20 is provided under a side of the semiconductor device 100. In some embodiments, the $n^+$-type drain region 5 is provided on the drain electrode 20. In some embodiments, the $n^+$-type drain region 5 is electrically connected to the drain electrode 20.

In some embodiments, the semiconductor region 1 of the $n^-$-type is provided on the drain region 5 of the $n^+$-type. In some embodiments, the gate electrode 10 is provided on the semiconductor region 1 of the $n^-$-type with the gate insulating region 11 interposed.

In some embodiments, the gate electrode 10 is multiply provided in the X-direction and each of the gate electrodes 10 extends in the Y-direction. That is, the gate electrode 10 is multiple gate electrodes provided in the X-direction and each of the gate electrodes extends in the Y-direction.

In some embodiments, on the semiconductor region 1 of the $n^-$-type, the base regions 2 of the p-type is provided respectively between the gate electrode 10 adjacent to each other (a first gate electrode and a second gate electrode). In some embodiments, the base regions 2 are provided on a second surface 1b opposite to a first surface 1a of the semiconductor regions 1 (see FIG. 6) and between the gate electrodes 10.

In some embodiments, the source region 3 of the $n^+$-type is provided on a portion of the base regions 2 of the p-type. In some embodiments, the contact region 4 of the $p^+$-type is provided on another portion of the base regions 2 of the p-type. In some embodiments, the source region 3 of the $n^+$-type and the contact region 4 of the $p^+$-type are provided alternately in the Y-direction between the gate electrodes 10.

In some embodiments, insulating regions 15 are provided between the respective source region 3 of the $n^+$-type and the respective contact region 4 of the $p^+$-type in the Y-direction. In some embodiments, the end portions of the insulating regions 15 are in contact with the gate insulating region 11 in X-direction. In some embodiments, the length of the insulating regions 15 in Z-direction is longer than that of the source region 3 of the n+-type in Z-direction. In some embodiments, the lower end of the insulating regions 15 is positioned lower than the boundary surface of the base regions 2 of the p-type and the source region 3 of the n+-type.

In some embodiments, the source electrode 21 is provided on the source region 3 of the n+-type and the contact region 4 of the p+-type. In some embodiments, the source electrode 21 is electrically connected to the source region 3 of the n+-type and the contact region 4 of the p+-type. In some embodiments, the gate insulating region 11 is provided between the gate electrode 10 and the source electrode 21 so that the gate electrode 10 and the source electrode 21 are divided electrically.

On/Off status of the semiconductor device 100 will now be described as follows.

In some embodiments, the semiconductor device 100 may be switched to the on-state by applying a voltage not less than a threshold to the gate electrode 10 in the state in which a voltage that is positive with respect to the source electrode 21 is applied to the drain electrode 20. At this time, a channel (an inversion layer) may be formed in the region of the base regions 2 of the p-type vicinity of the gate insulating region 11. Free electrons may flow from the source electrode 21 to the drain electrode 20 via the channel. After that, the channel in the region of the base regions 2 of the p-type may disappear by applying a voltage less than a threshold to the gate electrode 10. At this time, the semiconductor device 100 may be switched to the off-state.

When the semiconductor device 100 is switched from the on-state to the off-state, a larger positive voltage (or a surge voltage) may be applied to the drain electrode 20 temporarily by the inductance component of the circuit coupled to the semiconductor device 100. Avalanche breakdown may occur in the semiconductor region 1 when the surge voltage is applied to the drain electrode 20. At this time, holes and free electrons may be generated due to the Avalanche breakdown. The generated holes may be discharged from the source electrode 21 via the base regions 2 of the p-type and the contact region 4 of the p+-type. The generated free electrons may be discharged from the drain electrode 20 via the drain region 5 of the n+-type.

Here, an avalanche state means the state in which a voltage that exceeds the breakdown voltage of the semiconductor device 100 is applied to the semiconductor device 100 and a current is being conducted.

Figure 2A:
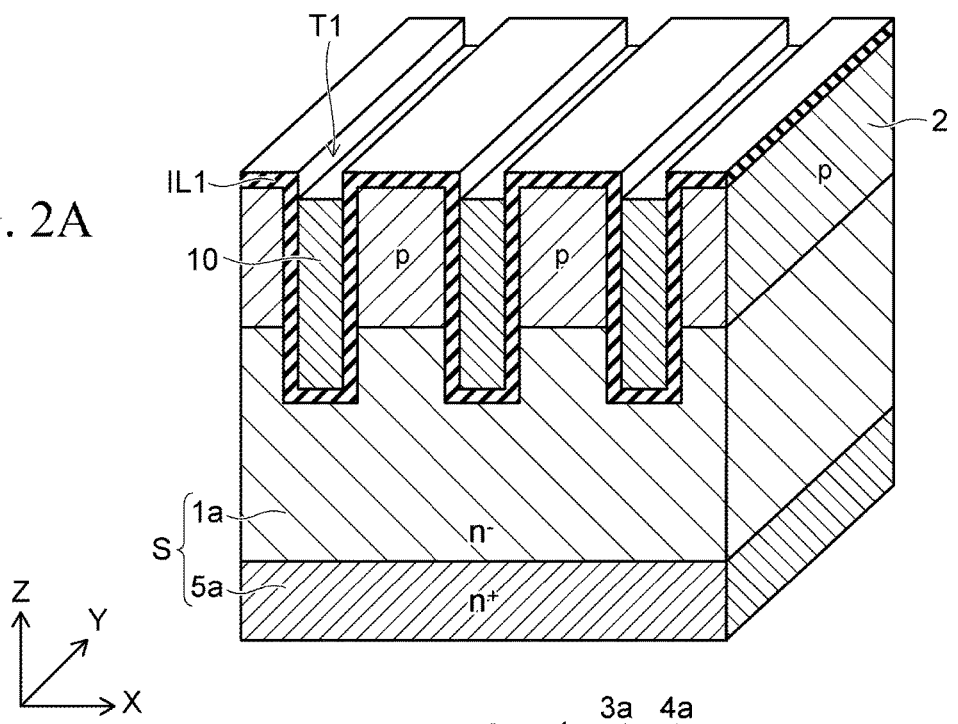
FIG. 2(a), FIG. 2(b), FIG. 3(a) and FIG. 3(b) are perspective cross-sectional views of the processes, showing an example of the manufacturing processes of the semiconductor device according to some embodiments.

An example of materials included in the respective components will now be described as follows. Subsequently, as shown in FIG. 2(a), in some embodiments, a first insulating region IL1 is formed on the n−-type semiconductor layer 1a and on the p-type semiconductor region 2. The first insulating region IL1 may include, for example, silicon oxide. For example, the first insulating region IL1 can be formed by thermal oxidation of the front surface of the n−-type semiconductor layer 1a and the front surface of the p-type semiconductor region 2.

In some embodiments, the semiconductor region 1 of the n−-type, the base regions 2 of the p-type, the source region 3 of the n+-type, the contact region 4 of the p+-type, and the drain region 5 of the n+-type may include silicon (Si) or silicon carbide (SiC) as the semiconductor material. When used silicon as the semiconductor material, for example, arsenic, phosphorus, or antimony may be used as the n-type impurity. Boron may be used as the p-type impurity.

For example, the gate electrode 10 may include polysilicon as conductive material.

In some embodiments, the gate insulating region 11 and the insulating regions 15 include, for example, silicon oxide as insulating material.

In some embodiments, the drain electrode 20 and the source electrode 21 include, for example, aluminum or some other metals.

An example of the method for manufacturing the semiconductor device 100 according to some embodiments will now be described using FIG. 2(a), FIG. 2(b), FIG. 3(a) and FIG. 3(b).

FIG. 2(a), FIG. 2(b), FIG. 3(a) and FIG. 3(b) are perspective cross-sectional views of the processes, showing an example of the manufacturing processes of the semiconductor device 100 according to some embodiments.

First, a semiconductor substrate S is prepared. In some embodiments, the semiconductor substrate S includes a n+-type semiconductor layer 5a and a n−-type semiconductor layer 1a. Then, in some embodiments, the base regions 2 of the p-type is formed by performing ion implantation of a p-type impurity into the upper surface portion of n−-type semiconductor layer 1a. Then, in some embodiments, multiple trenches T1 to pierce (or penetrating) the base regions 2 of the p-type are formed on the upper surface portion of n−-type semiconductor layer 1a.

Then, in some embodiments, the first insulating region IL1 is formed on the inner wall of the Trenches T1 by thermal oxidation of the semiconductor substrate S. Subsequently, as shown in FIG. 2(a), in some embodiments, the gate electrode 10 is formed by forming the conducive layer on the first insulating region IL1 in the Trenches T1.

Figure 2B:
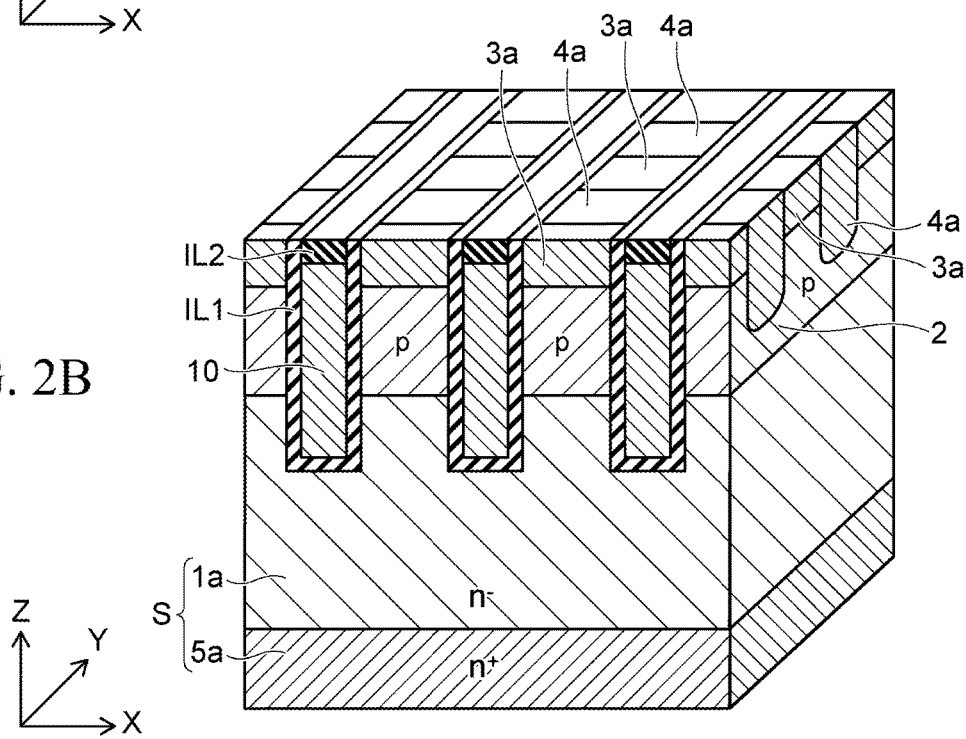

Then, in some embodiments, an n-type impurity region 3a and a p-type impurity region 4a are formed by sequentially performing ion implantation of an n-type impurity and a p-type impurity into the upper surface portion of the base regions 2 of the p-type. Then, in some embodiments, a second insulating region IL2 is formed to cover the gate electrode 10. Subsequently, as shown in FIG. 2(b), in some embodiments, the upper surface of the n-type impurity region 3a and a portion of the upper surface of the p-type impurity region 4a are exposed by removing a portion of the first insulating region IL1 and a portion of the second insulating region IL2.

Figure 3A:
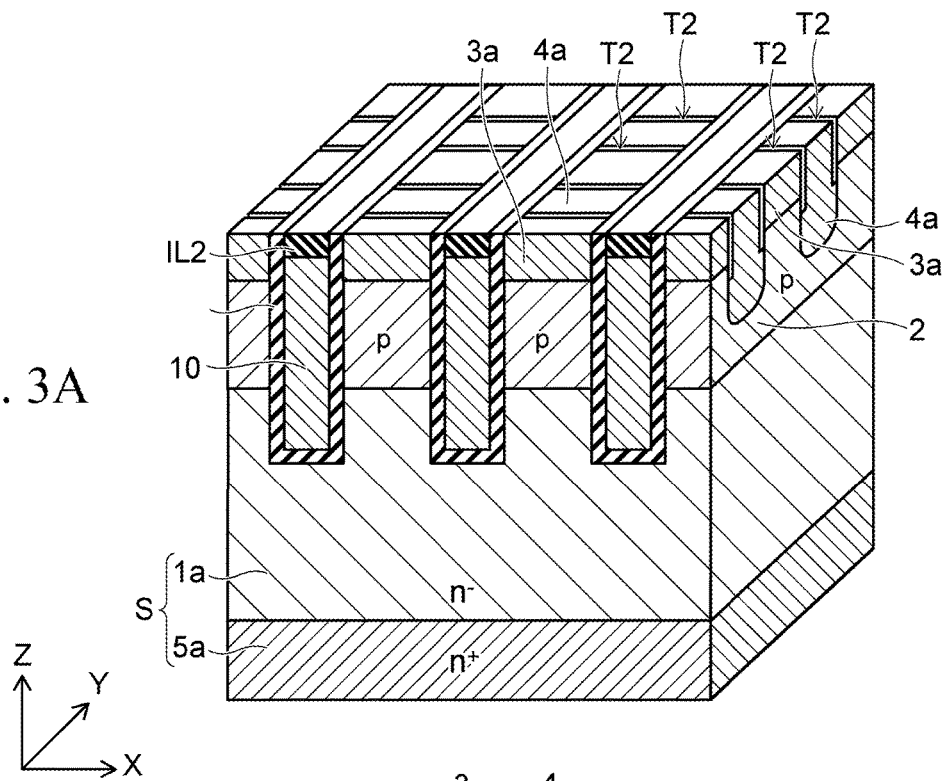

Then, as shown in FIG. 3(a), in some embodiments, a plurality of trenches T2 are formed on the upper surface of the n−-type semiconductor layer 1a. At this time, in some embodiments, the n-type impurity region 3a and the p-type impurity region 4a are decoupled with the trenches T2. In FIG. 3(a), in some embodiments, the trenches T2 are formed by removing a portion of the p-type impurity region 4a in some embodiments. In some embodiments, the trenches T2 may be formed by removing a portion of the n-type impurity region 3a or removing both a portion of the n-type impurity region 3a and a portion of the p-type impurity region 4a.

Figure 3B:
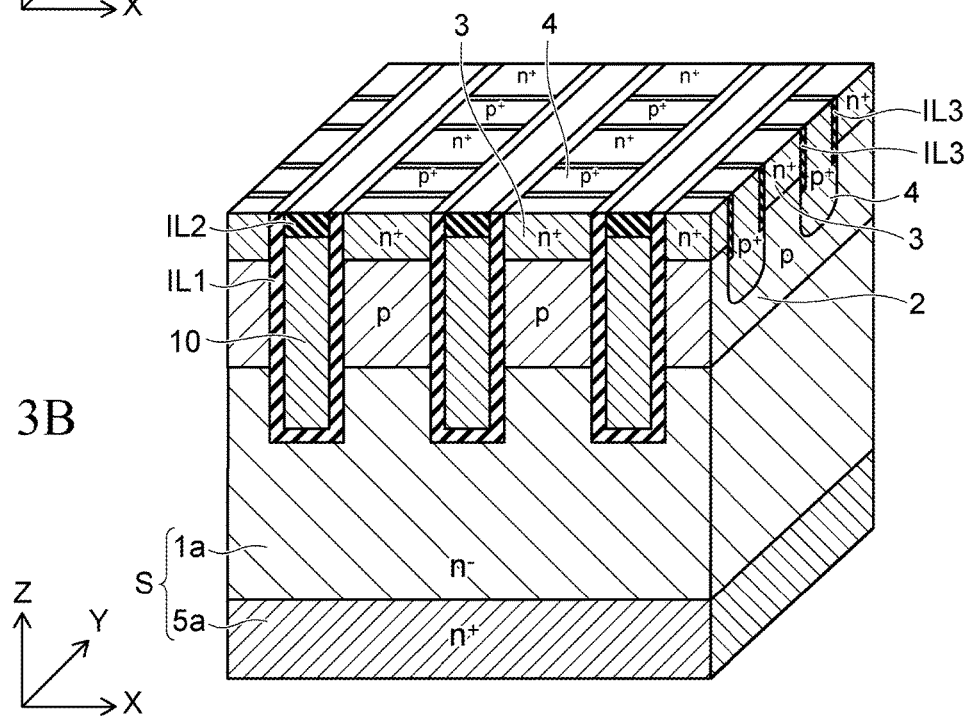

Then, in some embodiments, a third insulating region IL3 is formed by implanting the trenches T2. Then, in some embodiments, as shown in FIG. 3(b), the source region 3 of the n+-type and a contact region 4 of the p+-type are formed by activating the impurities implanted in the n-type impurity region 3a and the p-type impurity region 4a with heating the semiconductor substrate S.

Then, in some embodiments, metal layer is formed to cover the source region 3 of the n+-type and the contact region 4 of the p+-type. Then, in some embodiments, the source electrode 21 is formed by patterning the metal layer. Subsequently, in some embodiments, the back surface of the n+-type semiconductor layer 5a is polished until the n+-type semiconductor layer 5a has the prescribed thickness. Subsequently, in some embodiments, by forming the drain electrode 20 on the back surface of the n$^+$-type semiconductor layer 5a, the semiconductor device 100 shown in FIG. 1 is obtained.

As an example of the method for manufacturing described above, trenches T1 and trenches T2 may be formed by performing RIE (Reactive Ion Etching). In some embodiments, the first insulating region IL1 and the third insulating region IL3 may be formed by using thermal oxidation or CVD (Chemical Vapor Deposition). In some embodiments, the metal layer forming the drain electrode 20 and the source electrode 21 may be formed by performing sputtering method.

The effects of the semiconductor device 100 according to some embodiments will now be described with FIG. 4(a) and FIG. 4(b).

Figure 4A:
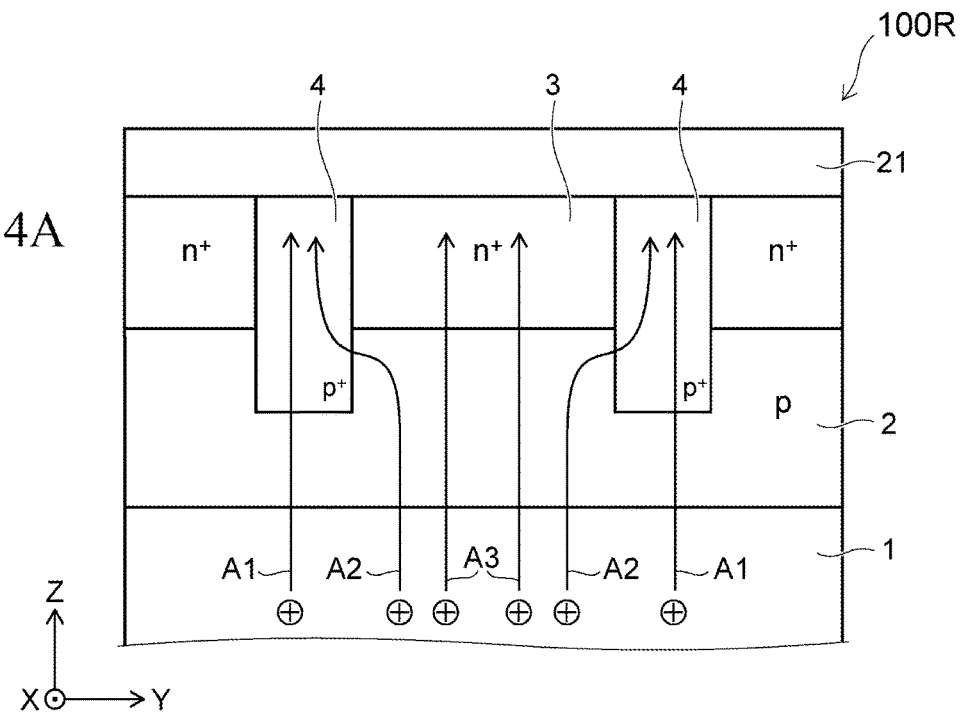
FIG. 4 (a) is a cross-sectional view showing a portion of the semiconductor device according to a reference.
Figure 4B:
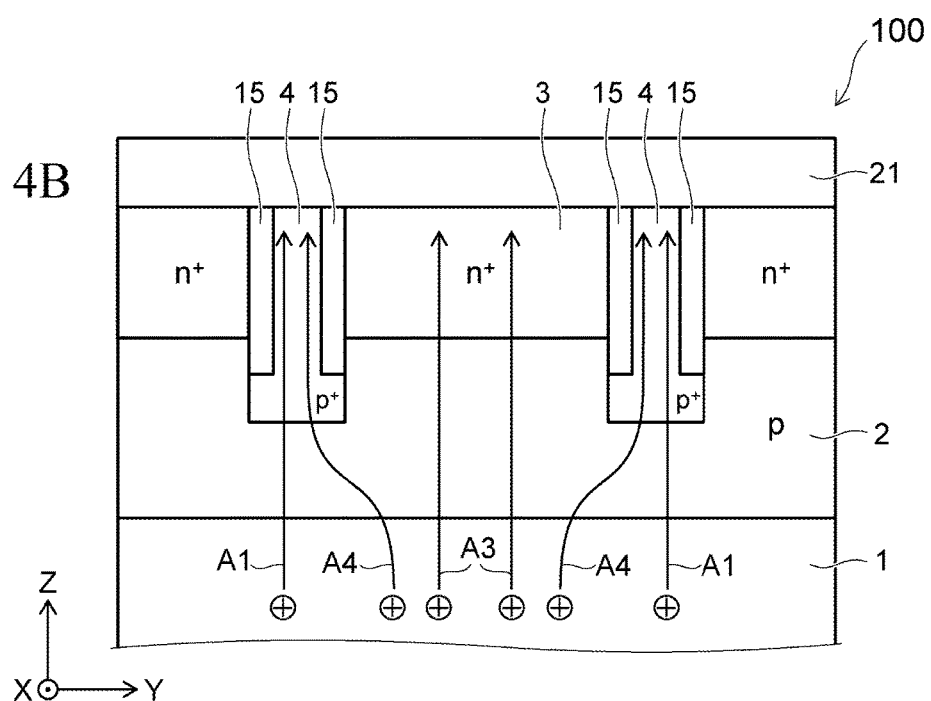

FIG. 4(a) and FIG. 4(b) are cross-sectional views of the semiconductor device along the Y-Z plane. FIG. 4(a) is a perspective cross-sectional view showing a portion of a semiconductor device 100R according to a comparative example. FIG. 4(b) is a perspective cross-sectional view showing a portion of a semiconductor device 100 according to some embodiments.

The semiconductor device 100R differs from the semiconductor device 100 in that the semiconductor device 100R according to the comparative example does not include the insulating regions 15.

As described above, the holes that are generated in the semiconductor device may be discharged to the source electrode 21 via the base regions 2 of the p-type and the contact region 4 of the p$^+$-type. When not provided the insulating regions 15, for example, the holes are discharged to the source electrode 21 via the route according to the arrows from A1 to A3 in FIG. 4(a). About the route A2, the potential of the base region 2 of the p-type may tend to relatively rise because of the longer migration length in the base region 2 of the p-type. On the occasion that the potential of the base region 2 of the p-type rises more, the potential difference between the base regions 2 of the p-type and the source region 3 may get larger. On that time, a parasitic transistor including the source region 3 of the n$^+$-type, the base regions of the p-type, and the semiconductor region 1 of the n$^-$-type may be activate. When the parasitic transistor be activate, the semiconductor device 100R may be destroyed.

On the other hand, in some embodiments, the insulating regions 15 is provided between the source region 3 of the n$^+$-type and the contact region 4 of the p+-type in the semiconductor device 100 according to some embodiments. in some embodiments, the lower side of the insulating region 15 is located deeper than the boundary surface between the base regions 2 of the p-type and the source region 3 of the n$^+$-type. According to above the structure of the insulating region 15, the holes generated below the source region 3 of the n$^+$-type may flow to the contact region 4 of the p$^+$-type below the lower side of the insulating region 15 via the route A4.

According to some embodiments of the semiconductor device 100, the potential rising in the base region 2 of the p-type may be reduced because of the shorter migration length of holes in the base region 2 of the p-type than the route A2 in FIG. 4(a).

According to some embodiments, the possibility of activation of the parasitic transistor is reduced by restraining the potential raise in the base regions 2 of the p-type vicinity of the source region 3 of the n$^+$-type when holes discharged to the source electrode 21 in the avalanche statec.

in some embodiments, the insulating regions 15 may be in contact with the gate insulating region 11, to more restrain the possibility of activation of the parasitic transistor. In some embodiments, the source region 3 of the n$^+$-type and the contact region 4 of the p$^+$-type may be mutually-separated with the insulating regions 15 over the entire area between the mutual gate insulating regions 11.

In some embodiments, the length of the source region 3 of the n$^+$-type in the Y-direction, the length of the contact region 4 of the p$^+$-type in the Y-direction, and the length of the insulating regions 15 in the Y-direction may be respectively changeable as appropriate. However, the shorter length of the source region 3 of the n+-type in the Y-direction may cause smaller channel area. Eventually, it may cause the on-resistance of the semiconductor device higher. So, in some embodiments, the length of the contact region 4 of the p$^+$-type in the Y-direction and the length of the insulating regions 15 in the Y-direction may be shorter than the length of the source region 3 of the n$^+$-type in the Y-direction.

When heating the semiconductor device in the example of the manufacturing processes of the semiconductor device according some embodiments, there may occur diffusion of impurities include in the n-type impurity region 3a and the p-type impurity region 4a. At this time, as if the n-type impurity region 3a is in contact with the p-type impurity region 4a, there may occur mutual diffusion of impurities. On occasion of the mutual diffusion of impurities, the function areas of the source region 3 of the n$^+$-type and the contact region 4 of the p$^+$-type decrease because n-type impurity an p-type impurity are mutually compensated.

The area decrease of the source region 3 of the n$^+$-type causes the channel area decrease. Eventually it causes the on-resistance of the semiconductor device higher. Also the area decrease of the contact region 4 of the p$^+$-type disturbs the discharge of holes to the source electrode 21 from the base regions 2 of the p-type and the contact region 4 of the p$^+$-type. Eventually it helps the activation of the parasitic transistor.

But according to the example of manufacturing the semiconductor device, as shown in the FIG. 3(a) and FIG. 3(b), the n-type impurity region 3a and the p-type impurity region 4a are provided above the base region 2 of the p-type. Next then the semiconductor device 100 is manufactured with the structure comprising the third insulating region IL3 between the n-type impurity region 3a and the p-type impurity region 4a. The mutual diffusion of impurities is reduced with this third insulating region IL3. As a result, the area decrease of the source region 3 of the n$^+$-type and the contact region 4 of the p$^+$-type is reduced. In other word, it is possible to manufacture the semiconductor device 100 more small, according to the rate of reducing of the both area decrease.

As shown in FIG. 3(a) and FIG. 3(b), the third insulating region IL3 is provided between the source region 3 of the n$^+$-type and the contact region 4 of the p$^+$-type. Also, the other structures may be embodied in a variety of other forms. For example, the third insulating region IL3 is provided between the activating source region 3 of the n$^+$-type with heating and the p-type impurity region 4a. Another example is as follows. The third insulating region IL3 may be provided between the activating contact region 4 of the p$^+$-type with heating and the n-type impurity region 3a. In some embodiments, either the n-type impurity region 3a or the p-type impurity region 4a may be activated, because the mutual compensation of n-type impurity and p-type impurity is reduced for at least one of the n-type impurity and the p-type impurity reduces its diffusion with this third insulating region IL3.

As shown in FIG. 3(a) and FIG. 3(b), in some embodiments, the semiconductor device S is heated after the third insulating region IL3 is manufactured between the n-type impurity region 3a and the p-type impurity region 4a. Next, in some embodiments, the source region 3 of the $n^+$-type and the contact region 4 of the $p^+$-type are manufactured by activating the impurities.

So, according to the example of manufacturing the semiconductor device 100 in some embodiments, the mutual diffusion of impurities between the n-type impurity region 3a and the p-type impurity region 4a may be reduced. As a result, the area decrease of the source region 3 of the $n^+$-type and the contact region 4 of the $p^+$-type may be reduced. In other word, it is possible to manufacture the semiconductor device 100 more small, according to the reduced rate of the area decrease of both regions (i.e., the source region 3 of the $n^+$-type and the contact region 4 of the $p^+$-type).

According to an example of manufacturing the semiconductor device, as shown in the FIG. 3(a) and FIG. 3(b), the third insulating region IL3 is manufactured after the n-type impurity region 3a and the p-type impurity region 4a are provided. Next, in some embodiments, the source region 3 of the $n^+$-type and the contact region 4 of the $p^+$-type are manufactured by activating the impurities with heating. The method of manufacturing the semiconductor device 100 is not limited to this example.

Another example is as follows. First, the n-type impurity region 3a may be provided. Next, the plurality of the insulating regions may be provided in the n-type impurity region. Next, the p-type impurity region 4a may be provided among a portion of the plurality of the insulating regions. Next, the source region 3 of the $n^+$-type and the contact region 4 of the $p^+$-type may be manufactured by activating the impurities with heating.

Some other example is as follows. First, the source region 3 of the $n^+$-type may be provided. Next, the plurality of the insulating regions may be provided in the source region 3 of the $n^+$-type. Next, the p-type impurity region 4a may be provided among a portion of the plurality of the insulating regions. Next, the contact region 4 of the $p^+$-type may be manufactured by activating the impurities with heating.

In some embodiments, respective impurity regions, manufacturing sequence of insulating region, and activating timing may be changeable appropriately to reduce the mutual diffusion of n-type impurity and p-type impurity.

Figure 5:
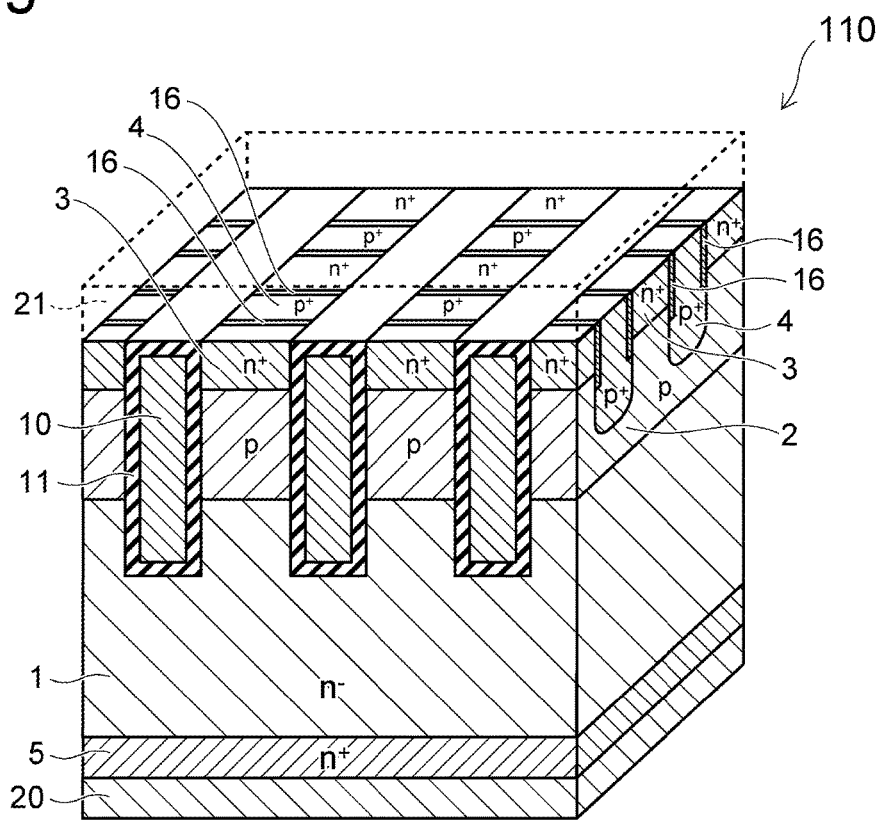
FIG. 5 is a perspective cross-sectional view showing a portion of the semiconductor device according to some embodiments.

FIG. 5 is a perspective cross-sectional view showing a portion of the semiconductor device 110 according to some embodiments.

In FIG. 5, a source electrode 21 is indicated as transparent with a dotted line.

For example, the semiconductor device 110 differs from the semiconductor device 100 (see FIG. 1) in that the semiconductor device 110 includes a metal region 16 instead of the insulating region 15.

In some embodiments, the allocation and the structure of the metal region 16 is similar to the insulating region 15. In some embodiments, the metal region 16 is provided between the source regions 3 of the $n^+$-type and the contact regions 4 of the $p^+$-type respectively in the Y-direction. In some embodiments, the lower side of the metal region 16 is positioned lower than the boundary surface of the base regions 2 of the p-type and the source region 3 of the $n^+$-type.

In some embodiments, the metal region 16 is electrically connected to the base region 2 of the p-type, the source region 3 of the $n^+$-type and the contact region 4 of the $p^+$-type. In some embodiments, the source region 3 of the $n^+$-type and the contact region 4 of the $p^+$-type are connected to the source electrode 21 in their upper surface. In some embodiments, the source region 3 of the $n^+$-type and the contact region 4 of the $p^+$-type are connected to the source electrode 21 via the metal region 16 in their side surface.

The metal region 16 may include, for example, tungsten or some other metals.

According to some embodiments, the possibility of activation of the parasitic transistor is reduced like as the semiconductor device 100, because the semiconductor device 110 has the structure such that the metal region 16 is provided between the source region 3 of the $n^+$-type and the contact region 4 of the $p^+$-type and the lower side of the metal region 16 is positioned lower than the boundary surface of the base regions 2 of the p-type and the source region 3 of the $n^+$-type.

According to some embodiments like the semiconductor device 110, the possibility of activation of the parasitic transistor is more reduced than the semiconductor device 100. This is because the potential fluctuation in the base region 2 of the p-type is more reduced than the semiconductor device 100, as the semiconductor device 110 has the base region 2 of the p-type to be connected to the source electrode 21 via the metal region 16.

In some embodiments, the semiconductor device 110 is manufactured as follows. The trench T2, for example, is embedded with some metal material after performing the process showed in FIG. 2(a) to FIG. 3(a). Next, in some embodiments, the source electrode 21 and the drain electrode 20 is manufactured.

According to manufacturing the semiconductor device 110 in some embodiments, like the example of manufacturing the semiconductor device 100, the mutual diffusion of impurities between the n-type impurity region 3a and the p-type impurity region 4a may be reduced with the metal region 16.

Figure 6:
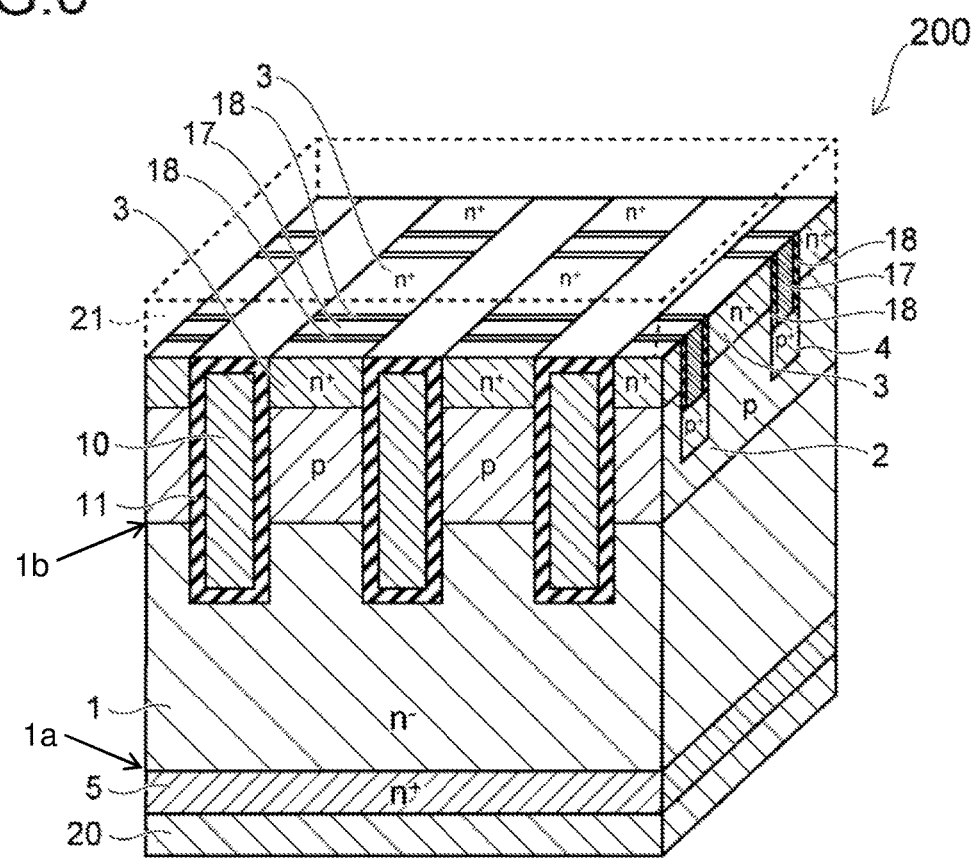
FIG. 6 is a perspective cross-sectional view showing a portion of the semiconductor device according to some embodiments.

FIG. 6 is a perspective cross-sectional view showing a portion of the semiconductor device 200 according to some embodiments. In FIG. 6, a source electrode 21 is indicated as transparent with a dotted line. The semiconductor device 200 differs from the semiconductor device 100 (see FIG. 1) in that a metal region 17 and an insulating region 18 is provided instead of the insulating region 15.

In some embodiments, in the semiconductor device 200, the source region 3 of the $n^+$-type provided on the portion of the base regions 2 of the p-type is positioned upper than the contact region 4 of the $p^+$-type provided on the other portion of the base regions 2 of the p-type.

In some embodiments, the metal region 17 and the insulating region 18 are provided on the contact region 4 of the $p^+$-type. In some embodiments, the source region 3 of the $n^+$-type and the metal region 17 are provided alternately in the Y-direction between the gate insulating regions 11. In some embodiments, the insulating regions 18 are provided between the respective source region 3 of the $n^+$-type and the respective metal regions 17.

In some embodiments, the metal region 17 and the insulating region 18 extend in the X-direction. In some embodiments, the metal region 17 and the insulating region 18 are connected to the gate insulating region 11. In some embodiments, the metal region 17 is electrically connected to the contact region 4 of the $p^+$-type and the source electrode 21. In some embodiments, the contact region 4 of the $p^+$-type is electrically connected to the source electrode 21 via the metal layer 17.

An example of the method for manufacturing the semiconductor device 200 according to some embodiments will now be described using FIG. 7(a), FIG. 7(b), FIG. 8(a) and FIG. 8(b).

FIG. 7(a), FIG. 7(b), FIG. 8(a) and FIG. 8(b) are perspective cross-sectional views of the processes, showing the example of the manufacturing processes of the semiconductor device 200 according to some embodiments.

Figure 7A:
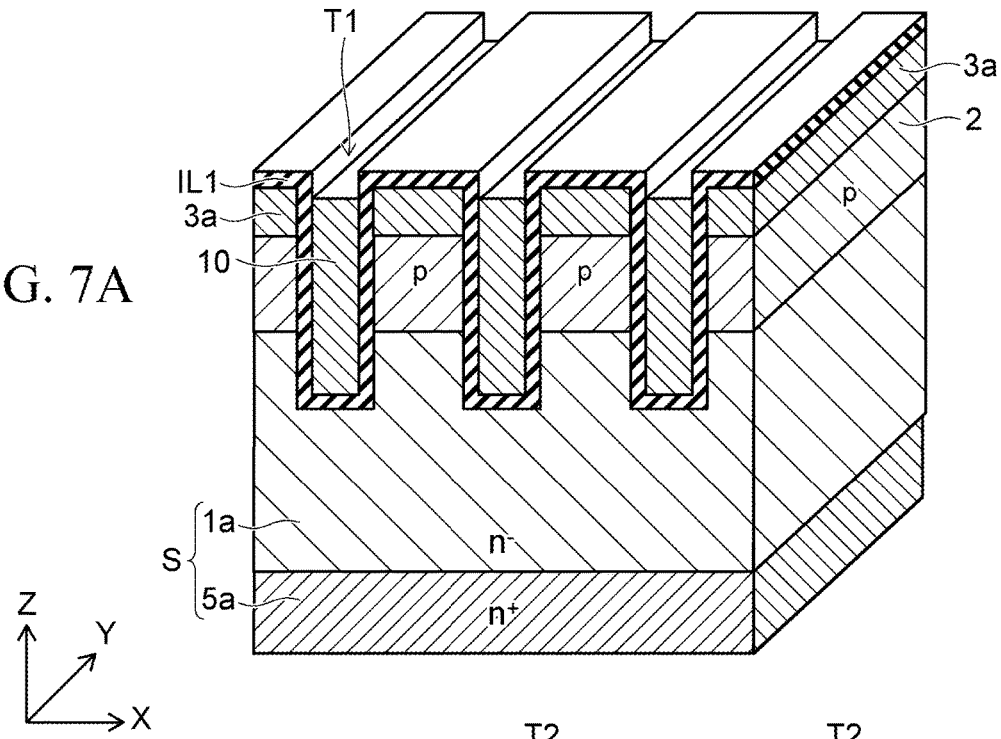
FIG. 7(a), FIG. 7(b), FIG. 8(a) and FIG. 8(b) are perspective cross-sectional views of the processes, showing an example of the manufacturing processes of the semiconductor device according to some embodiments.
Figure 7B:
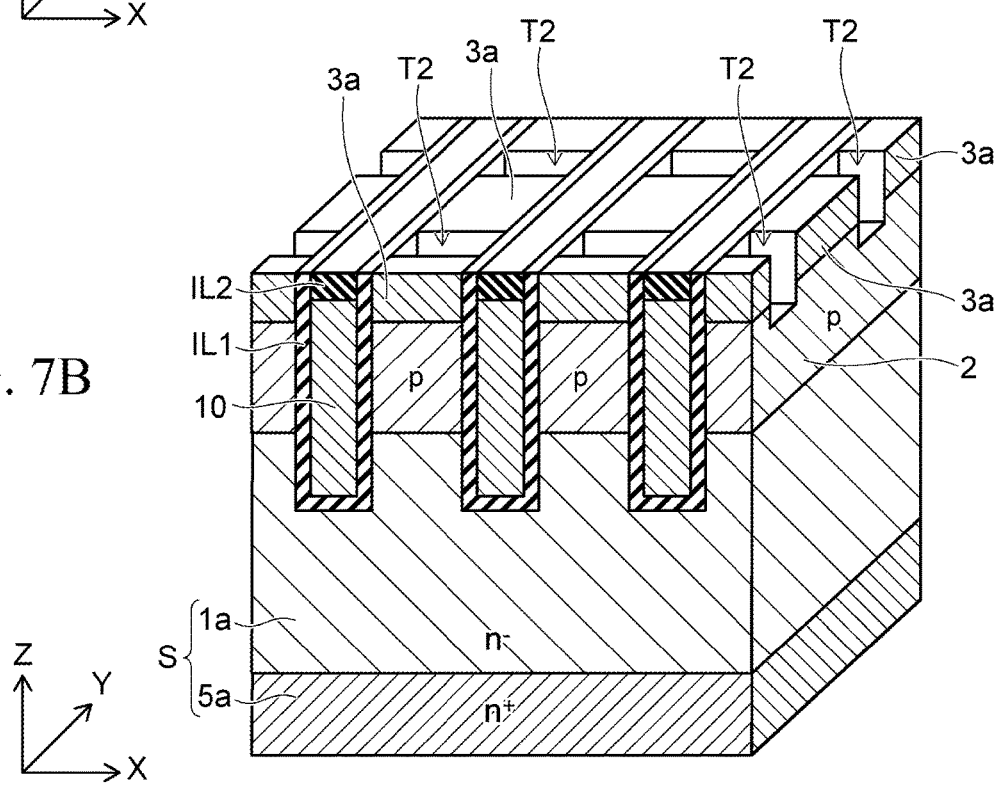

First, in some embodiments, like the process as shown in FIG. 2(a), the base regions 2 of the p-type and the gate electrode 10 are formed on a semiconductor substrate S. Next, in some embodiments, as shown in FIG. 7(a), an n-type impurity region 3a is formed by performing ion implantation into the upper surface portion of the base regions 2 of the p-type.

Next, in some embodiments, a second insulating region IL2 is formed on a first insulating region IL1. Next, in some embodiments, the upper surface of the n-type impurity region 3a is exposed by removing a portion of the first insulating region IL1 and a portion of the second insulating region IL2. Next, in some embodiments, as shown in the FIG. 7(b), multiple trenches T2 are formed to pierce (or penetrating) the n-type impurity region 3a and to reach the base regions 2 of p-type.

Figure 8A:
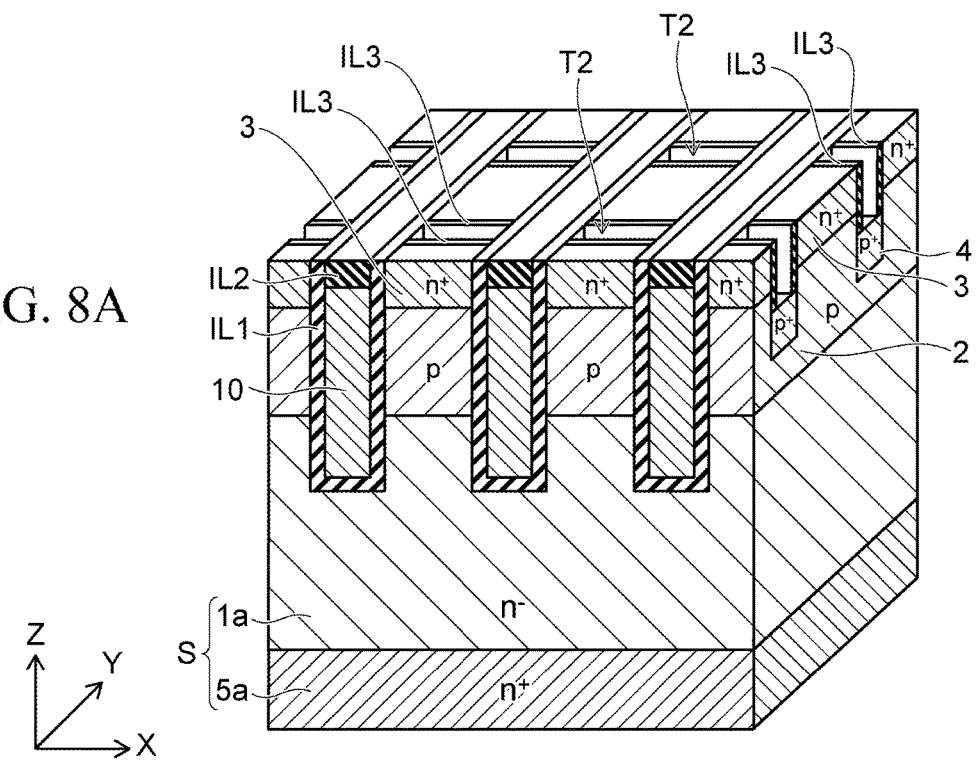

Next, in some embodiments, the third insulating region IL3 is formed on the inner wall of the trenches T2 and the upper surface of the n-type impurity region 3a. Then, in some embodiments, the p-type impurity region 4a is formed in the base regions 2 of the p-type by performing ion implantation of a p-type impurity into the bottom of the trenches T2. Then, in some embodiments, the source region 3 of the $n^+$-type and a contact region 4 of the $p^+$-type are formed by activating the impurities implanted. Next, in some embodiments, as shown in FIG. 8(a), the third insulating region IL3 formed on the upper surface of the n-type impurity region 3a and the bottom of the trench T2 are removed so as to leave the third insulating region IL3 formed on the sidewall of the trench T2. In some embodiments, the insulating region 18 is formed by the above process.

Figure 8B:
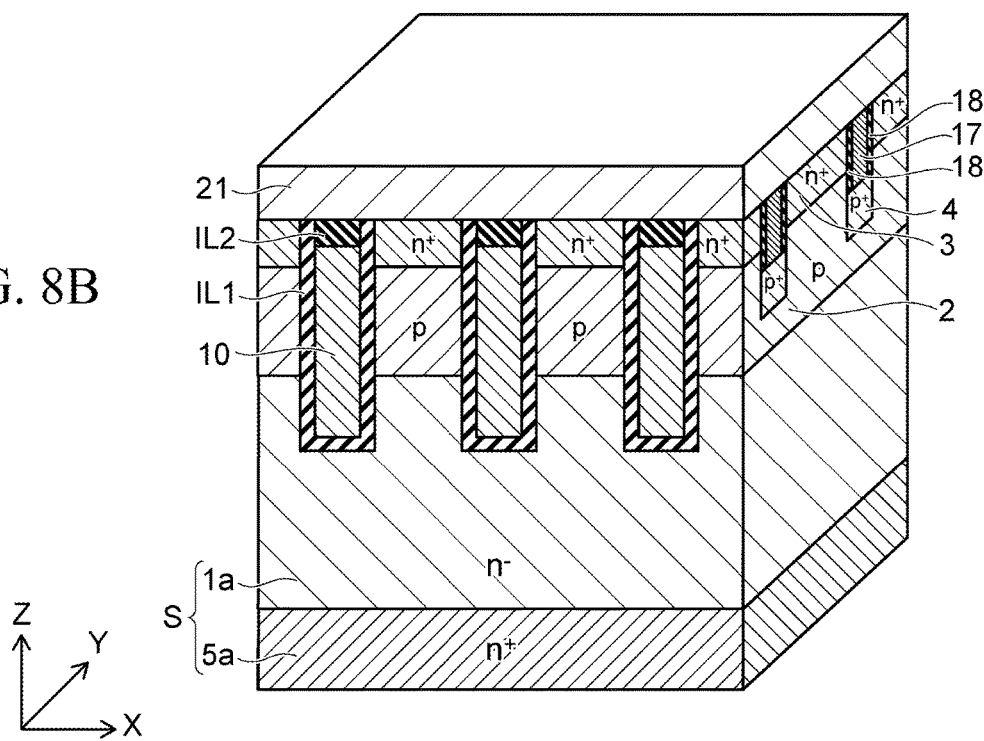

Next, in some embodiments, the metal region 17 is formed by embedded the trench T2 with the some metal material. Then, in some embodiments, metal layer is formed to cover the source region 3 of the $n^+$-type and the metal region 17. Then, in some embodiments, as shown in FIG. 8(b), the source electrode 21 is formed by patterning the metal layer. Subsequently, in some embodiments, the back surface of the $n^+$-type semiconductor layer 5a is polished until the $n^+$-type semiconductor layer 5a has the prescribed thickness. Subsequently, in some embodiments, by forming the drain electrode 20 on the back surface of the $n^+$-type semiconductor layer 5a, the semiconductor device 200 shown in FIG. 1 is obtained.

In the semiconductor device 200 according to some embodiments, the contact region 4 of the $p^+$-type is positioned lower than the source region 3 of the $n^+$-type. In some embodiments, the contact region 4 of the $p^+$-type is electrically connected to the metal region 17. With these structures, similar to the embodiments illustrated in FIGS. 1-5, the potential rising in the base region 2 of the p-type is reduced because of the shorter migration length of holes in the base region 2 of the p-type. With these structures, the possibility of activation of the parasitic transistor is reduced.

So, according to the example of manufacturing the semiconductor device 200 according to some embodiments, the location of the source region 3 of the $n^+$-type is different from the location of the contact region 4 of the $p^+$-type in Z-direction. With these structure, as same as the example of manufacturing the semiconductor device 100, the mutual diffusion of impurities is reduced. In some embodiments, the impurity concentration may drop in the source region 3 of the $n^+$-type and the contact region 4 of the $p^+$-type may be reduced.

In some embodiments, the insulating region 18 between the metal region 17 and the source region 3 of the $n^+$-type reduces the silicide reaction of metal and semiconductor device, the spiking phenomenon and so on, caused by heating the semiconductor substrate S. Eventually, that increases reliability of the semiconductor device FIG. 9 is a perspective cross-sectional view showing a portion of the semiconductor device 300 according to some embodiments.

Figure 9:
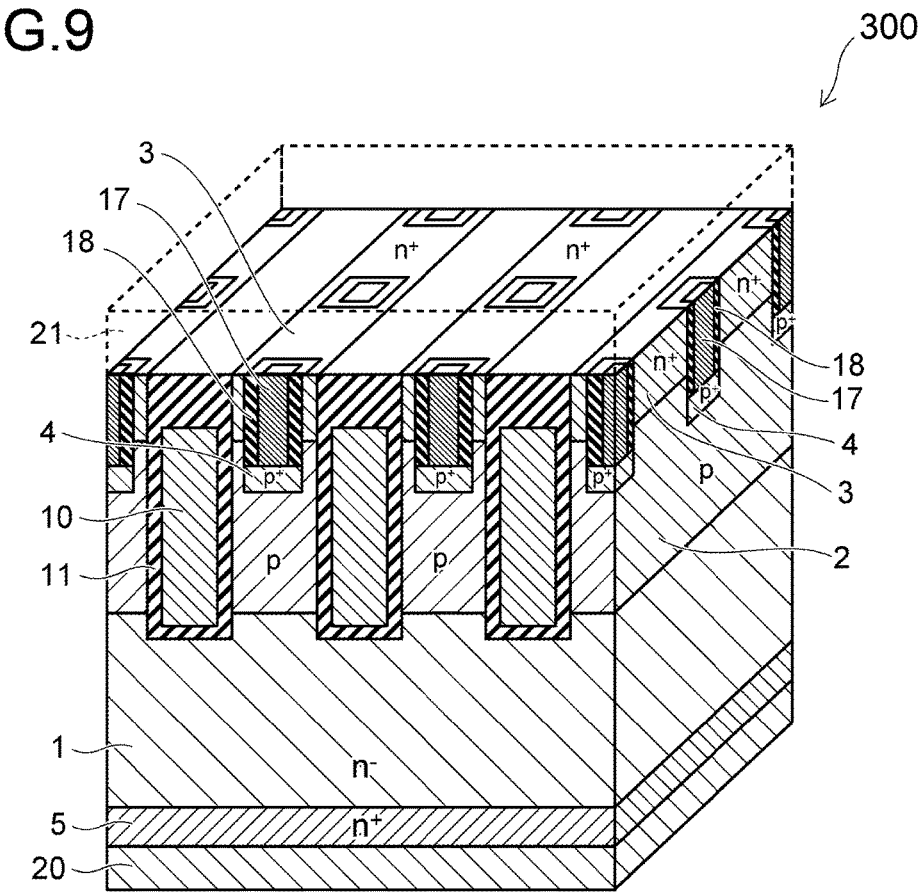
FIG. 9 is a perspective cross-sectional view showing a portion of the semiconductor device according to some embodiments.

In FIG. 9, a source electrode 21 is indicated as transparent with a dotted line.

The semiconductor device 300 differs from the semiconductor device 200 in that there is difference in the respective structures of the source region 3 of the $n^+$-type, the contact region 4 of the $p^+$-type, the metal region 17, and the insulating region 18.

In the semiconductor device 200, the contact region 4 of the $p^+$-type, a metal region 17 and an insulating region 18 are in contact with the gate insulating region 11. On the other hand, in the semiconductor device 300, the contact region 4 of the $p^+$-type, a metal region 17 and an insulating region 18 are disposed apart from the gate insulating region 11.

In some embodiments, the contact regions 4 of the $p^+$-type are provided multiply in the Y-direction between the gate insulating regions 11. That is, the contact regions 4 of the $p^+$-type are multiple contact regions in the Y-direction between the gate insulating regions 11. In some embodiments, the insulating regions 18 are provided between the respective source region 3 of the $n^+$-type and the respective metal regions 17. In some embodiments, the plurality of the contact regions 4 of the $p^+$-type are disposed apart from each other. In some embodiments, the metal region 17 are provided respectively on the contact regions 4 of the $p^+$-type. In some embodiments, the metal region 17 is surrounded by the source region 3 of the $n^+$-type. In some embodiments, there is provided the annular insulating region 18 between the source region 3 of the $n^+$-type and the metal region 17.

An example of the method for manufacturing the semiconductor device 300 according to some embodiments will now be described using from FIG. 10 to FIG. 13.

FIG. 10 to FIG. 13 are perspective cross-sectional views of the processes, showing the example of the manufacturing processes of the semiconductor device 300 according to some embodiments.

FIG. 10 to FIG. 13 are a plane view showing a manufacturing process, a line A-A' cross-sectional view and a line B-B' cross-sectional view of respective plane process views.

First, in some embodiments, like the process as shown in FIG. 2(a), the base regions 2 of the p-type and the gate electrode 10 are formed on a semiconductor substrate S. Next, in some embodiments, a source region 3 of the $n^+$-type is formed by performing ion implantation into the upper surface portion of the base regions 2 of the p-type. Then, in some embodiments, a second insulating region IL2 is formed on a first insulating region IL1 to cover a gate electrode 10. Then, in some embodiments, as shown in FIG. 10, the source region 3 of the $n^+$-type is exposed by formed the trenches T2 extending in the X-direction in the first insulating region IL1 and the second insulating region IL2.

Figure 10:
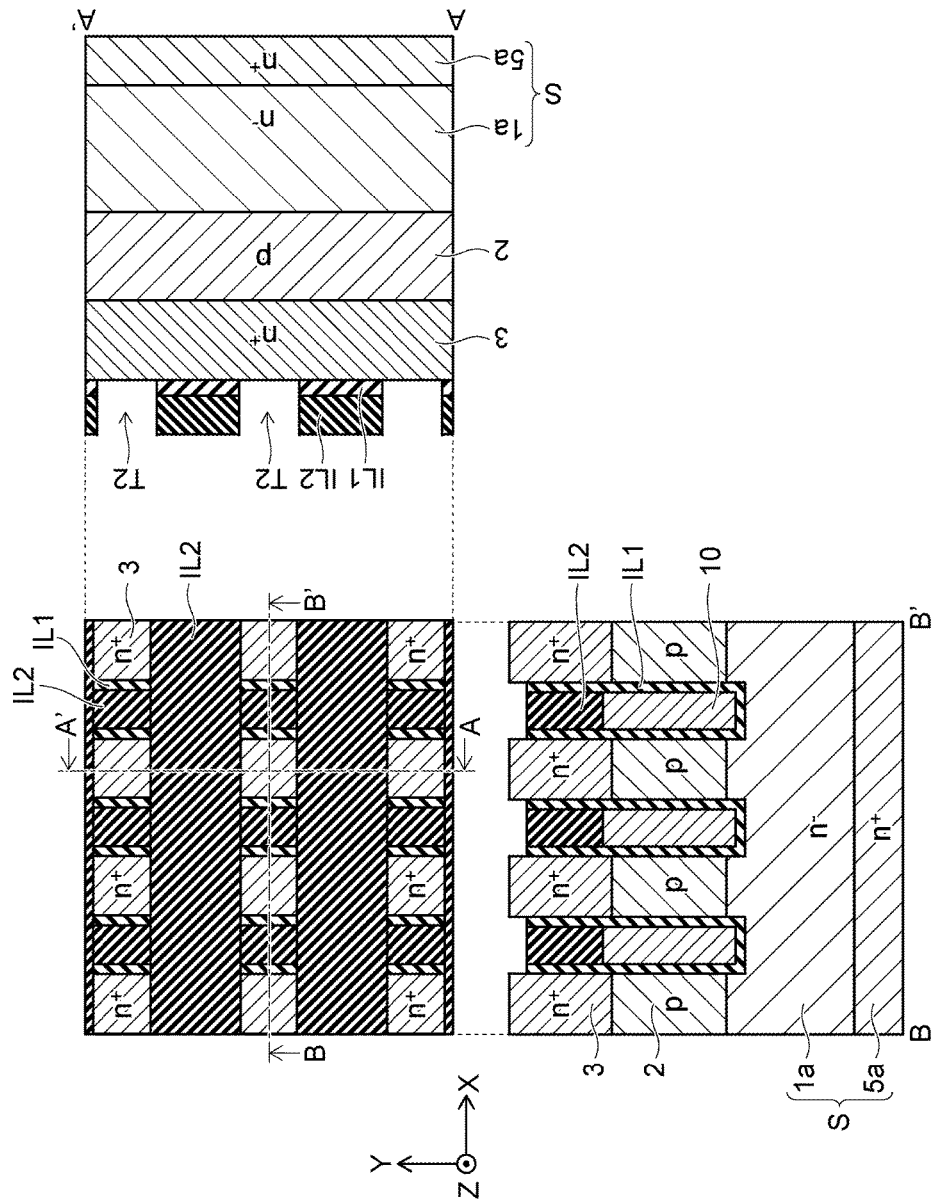
FIG. 10, FIG. 11, FIG. 12 and FIG. 13 are perspective cross-sectional views of the processes, showing the example of the manufacturing processes of the semiconductor device according to some embodiments.

In some embodiments, as shown in FIG. 10, the gate electrodes 10 extend in the Y-direction. In some embodiments, the source regions 3 of the n$^+$-type are provided between the respective gate electrodes 10. In some embodiments, the portion of the source region 3 of the n$^+$-type are exposed with the prescribed pitch in the Y-direction.

Then, in some embodiments, the portion of the source region 3 of the n$^+$-type is removed using the first insulating region IL1 and the second insulating region IL2 as the mask. Next, in some embodiments, concave portions R1 are formed (see FIG. 11). In some embodiments, as shown in FIG. 10, the portion of the source region 3 of the n$^+$-type are exposed with the prescribed pitch in the Y-direction. In some embodiments, the concave portions R1 are multiply provided with the prescribed pitch in the Y-direction. That is, the concave portions R1 are multiple concave portions provided with the prescribed pitch in the Y-direction.

Figure 11:
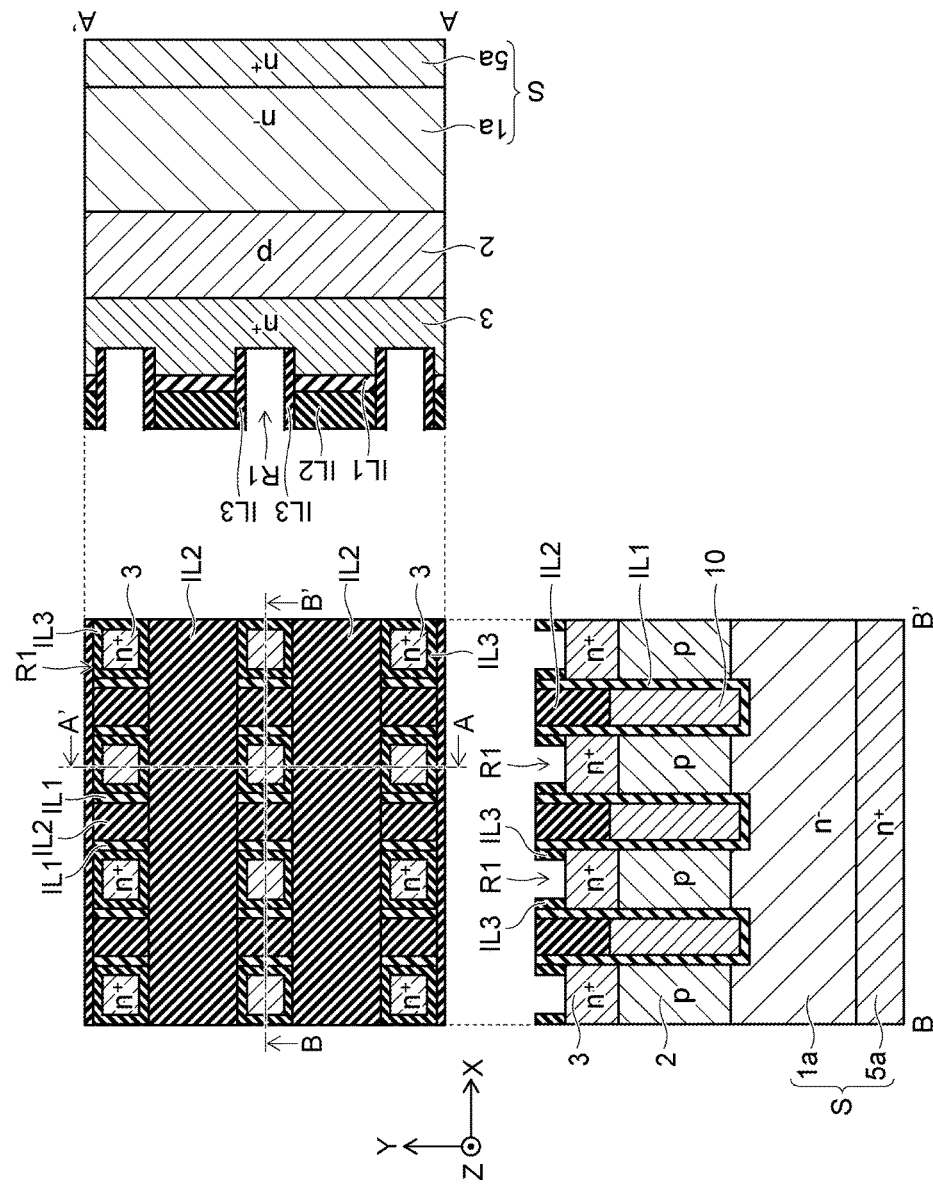

Next, in some embodiments, the third insulating region IL3 is formed on the inner wall of the concave portions R1. Then, in some embodiments, the third insulating region IL3 formed on the bottom of the concave portions R1 is removed with anisotropic etching so as to leave the third insulating region IL3 formed on the side wall of the concave portions R1. Through the process, in some embodiments, as shown in FIG. 11, the source regions 3 of the n$^+$-type in the bottom of the concave portions R1 are exposed.

Figure 12:
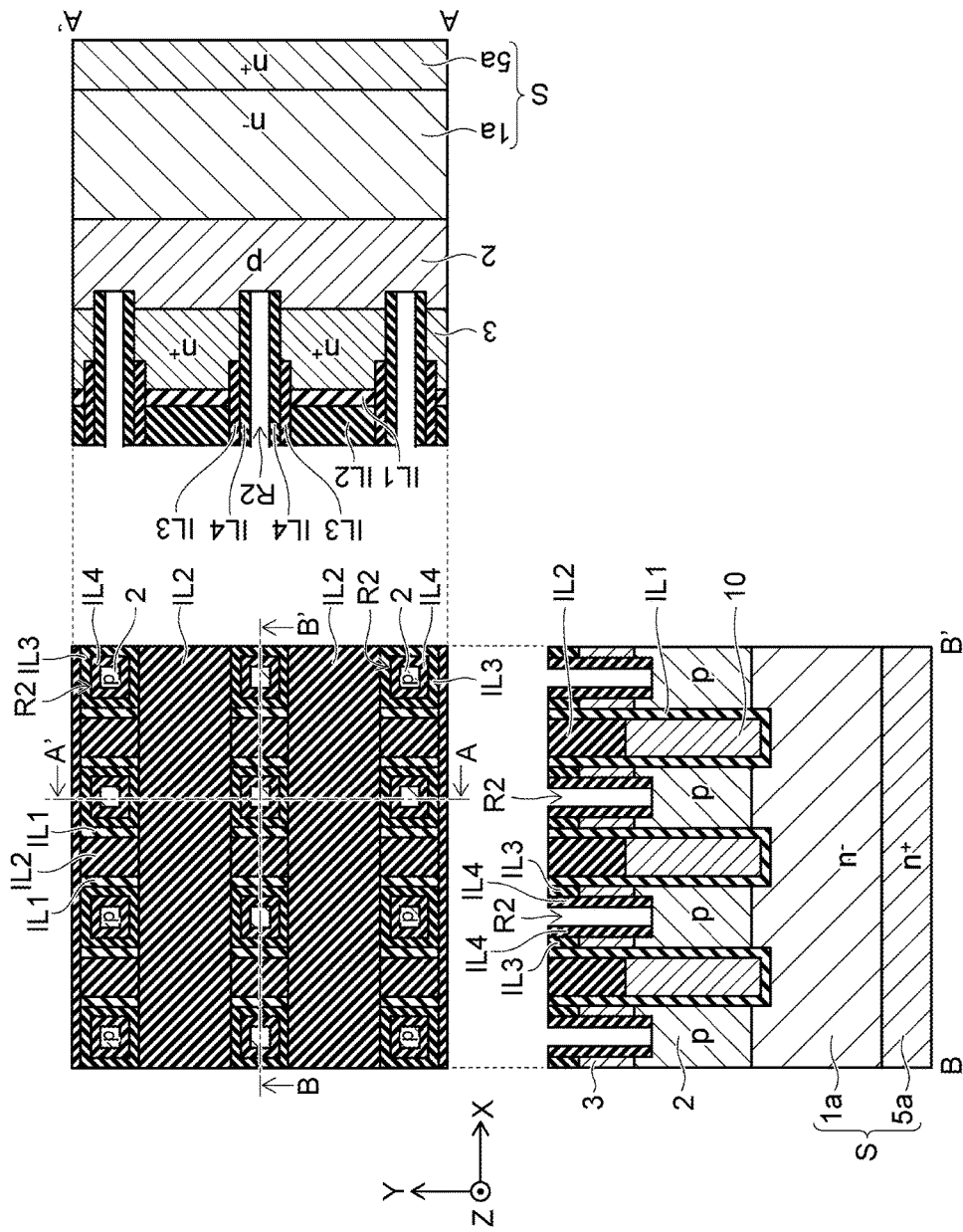

Then, in some embodiments, as shown in FIG. 12, concave portions R2 are formed in the concave portions R1 using the first insulating region IL1, the second insulating region IL2 and the third insulating region IL3 as the mask. In some embodiments, the concave portions R2 pierce (or penetrate) the source regions 3 of the n$^+$-type and reach the base regions 2 of p-type. Then, in some embodiments, a fourth insulating region IL4 is formed on the inner wall of the concave portions R2. Then, in some embodiments, the fourth insulating region IL4 formed on the bottom of the concave portions R2 is removed with anisotropic etching so as to leave the fourth insulating region IL4 formed on the side wall of the concave portions R2. Through the process, in some embodiments, as shown in FIG. 12, the base regions 2 of p-type in the bottom of the concave portions R2 are exposed.

Figure 13:
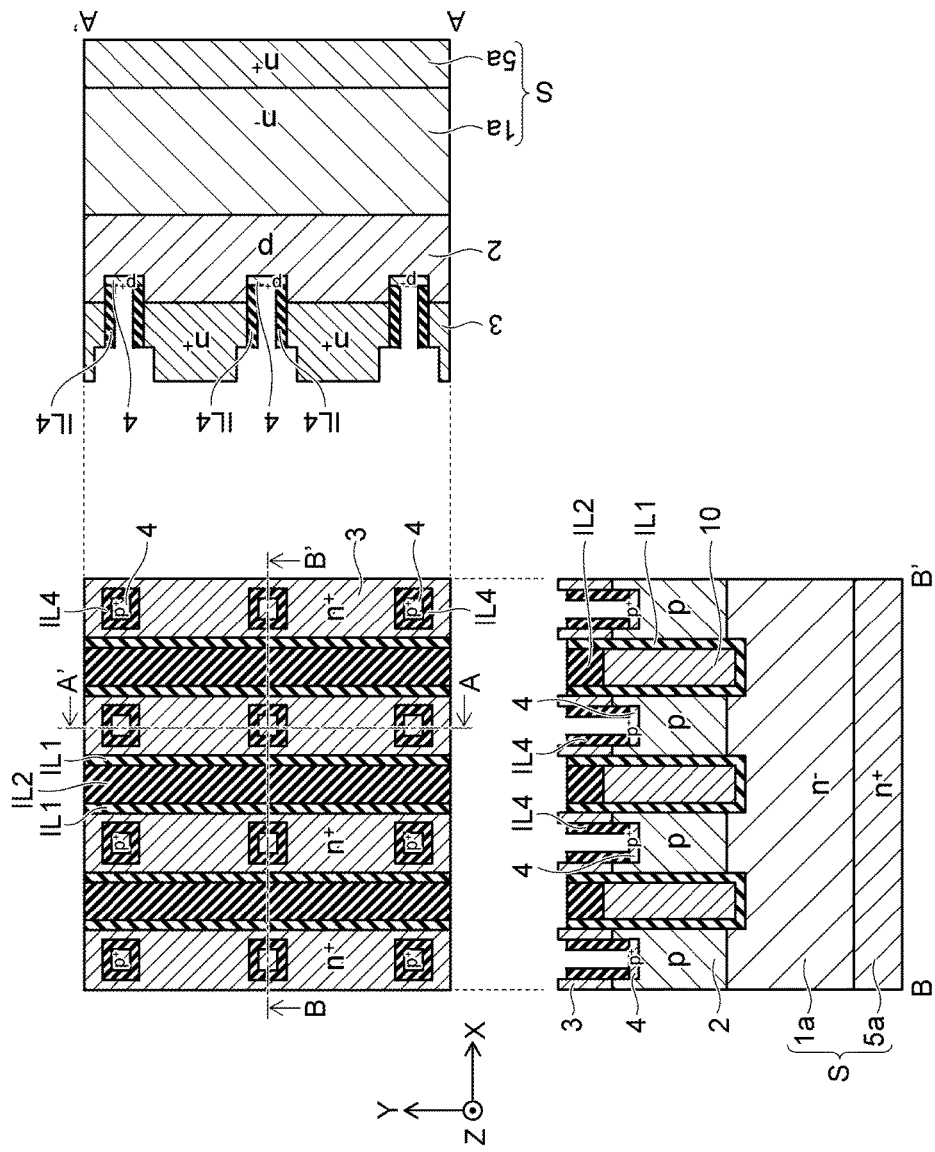

Then, in some embodiments, the p-type impurity region 4a is formed in the base regions 2 of the p-type by performing ion implantation of a p-type impurity through the concave portions R2. Then, in some embodiments, the insulating regions IL1-IL4 are removed with anisotropic etching from above so as to expose the upper portion of the source regions 3 of the n$^+$-type. In some embodiments, as shown in FIG. 13, the insulating regions IL1-IL3 formed on the source regions 3 of the n$^+$-type. In some embodiments, the fourth insulating region IL4 remaining on the side wall of the concave portions R2 corresponds to the insulating region 18 shown in FIG. 8(b).

Then, in some embodiments, the metal region 17 surround by the insulating region 18 is formed by implanting the concave portions R1 and R2 with some metal material. Then, in some embodiments, metal layer is formed to cover the source region 3 of the n$^+$-type, the metal region 17, and the insulating region 18. Then, in some embodiments, the source electrode 21 is formed by patterning the metal layer. In some embodiments, the metal layer and the source electrode 21 may be formed by depositing the same metal material in series.

Subsequently, in some embodiments, the back surface of the n$^+$-type semiconductor layer 5a is polished until the n$^+$-type semiconductor layer 5a has the prescribed thickness. Subsequently, in some embodiments, by forming the drain electrode 20 on the back surface of the n$^+$-type semiconductor layer 5a, the semiconductor device 300 shown in FIG. 9 is obtained.

In some embodiments, the fourth insulating region IL4 may be removed before forming the metal region 17. Through this process, in some embodiments, the semiconductor device 300 without the insulating region 18 is obtained.

In the semiconductor device 300 according to some embodiments, the contact region 4 of the p$^+$-type is positioned lower than the source region 3 of the n$^+$-type. In some embodiments, the contact region 4 of the p$^+$-type is electrically connected to the metal region 17. With these structures, the possibility of activation of the parasitic transistor is reduced.

According to the example of manufacturing the semiconductor device 300 according to some embodiments, after the concave portions R1 are formed in the source region 3 of the n$^+$-type, the third insulating regions IL3 are formed on the inner wall of the concave portions R1 and the concave portions R2 are formed. Then, in some embodiments, the p-type impurity region 4a is formed in the base regions 2 of the p-type by performing ion implantation of a p-type impurity through the concave portions R2. According to this process, in some embodiments, the concave portions R1 and R2 are formed in a self-aligned manner between the respective gate electrodes 10, and the p-type impurity region 4a may be formed.

In some embodiments, the position gap among the p-type impurity regions 4a between the respective gate insulating regions 11 is reduced. Eventually, the characteristic fluctuation differs from the respective semiconductor devises and the on-resistances of the semiconductor devices are reduced. In some embodiments, the channel area may be formed lager than an area of the structure in which the gate insulating region 11 is in contact with the p-type impurity regions 4a, because the p-type impurity regions 4a can be formed apart from the gate insulating region 11. Eventually, it may reduce the on-resistance of the semiconductor device.

Especially, on the condition that the gap between the respective gate insulating regions 11 to be relatively narrow, it is difficult to form the p-type impurity regions 4a apart from the gate insulating region 11 and the gap reduced concurrently. In some embodiments, the p-type impurity regions 4a may be formed apart from the gate insulating region 11 and the gap controlled more accurately.

According to an example of manufacturing, first the fourth insulating region IL4 is formed on the inner wall of the concave portions R2 and next, the p-type impurity regions 4a are formed. In some embodiments, the ion implantation of a p-type impurity into the source region 3 of the n$^+$-type is reduced. In some embodiments, the impurity concentration drop in the source region 3 of the n$^+$-type may be reduced.

Figure 14:
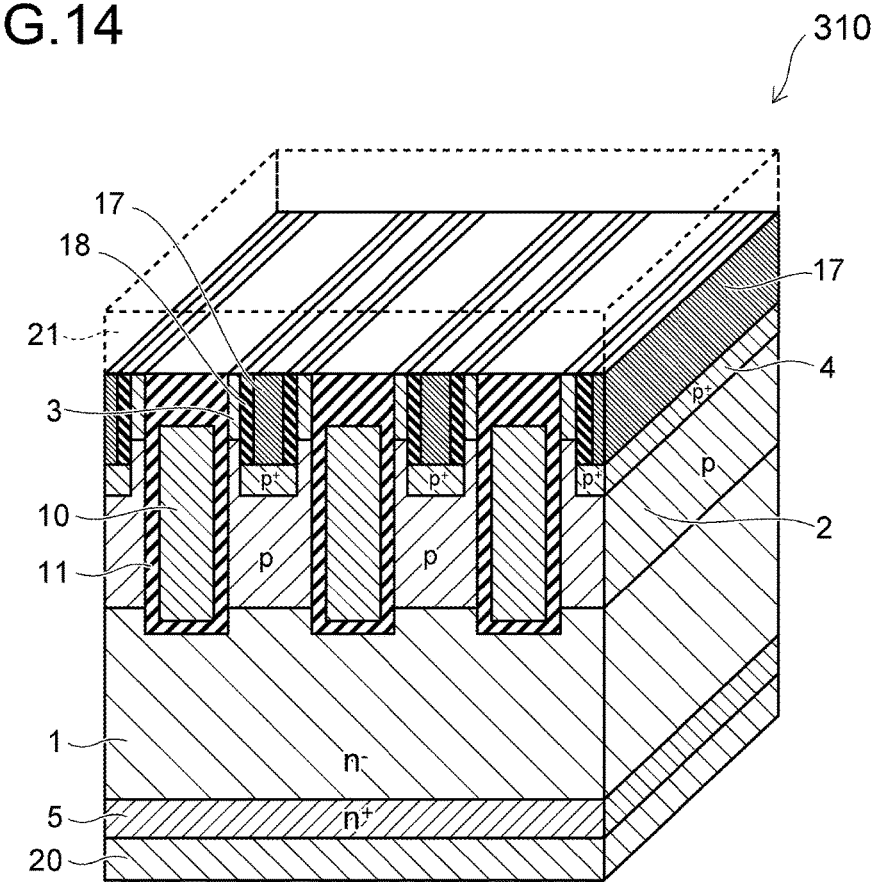
FIG. 14 is a perspective cross-sectional view showing a portion of the semiconductor device according to some embodiments.

FIG. 14 is a perspective cross-sectional view showing a portion of the semiconductor device 310 according to some embodiments.

In FIG. 14, a source electrode 21 is indicated as transparent with a dotted line.

For example, the semiconductor device 310 differs from the semiconductor device 300 in that a contact region 4 of the p$^+$-type, a metal region 17, and the insulating region 18 extend in the Y-direction.

In some embodiments, the source regions 3 of the n$^+$-type are multiply provided between the respective gate insulating regions 11. That is, source regions 3 of the n$^+$-type are multiple source regions provided between the respective gate insulating regions 11. In some embodiments, the insulating regions 18 are multiply provided between the respective source regions 3 of the n+-type. That is, the insulating regions 18 are multiple insulating regions provided between the respective source regions 3 of the n+-type. In some embodiments, the metal regions 17 are provided between the respective insulating regions 18.

With the configuration of the semiconductor device 310 in some embodiments, the possibility of activation of the parasitic transistor is reduced.

The semiconductor device 310 according to some embodiments is manufactured with the following step.

As shown in FIG. 10, for example, the whole upper surface of source regions 3 of the n+-type is exposed by removing the first insulating region IL1 and the second insulating region IL2. Next, in some embodiments, the concave portions R1 and R2 are formed in a self-aligned manner as the same step.

As shown in the example of the method for manufacturing the semiconductor device 310, in some embodiments, the p-type impurity regions 4a may be formed apart from the gate insulating region 11 and the gap among the p-type impurity regions 4a controlled more accurately. Eventually, the characteristic fluctuation differs from the respective semiconductor devises and the on-resistance of the semiconductor device may be reduced.

For example, it is possible to confirm the relative levels of the impurity concentrations of the semiconductor regions in some embodiments using SCM (scanning capacitance microscopy). Accordingly, the impurity concentrations in some embodiments may be replaced with the carrier concentrations. The relative levels of the carrier concentrations of the semiconductor regions can be confirmed using SCM.

For example, the impurity concentrations of the semiconductor regions can be measured using SIMS (secondary ion mass spectrometry).

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The specific structures of components shown in some embodiments (e.g., a semiconductor region 1 of the n−-type, a base regions 2 of the p-type, a source region 3 of the n+-type, a contact region 4 of the p+-type, a drain region 5 of the n+-type, a gate electrode 10, a gate insulating region 11, an insulating regions 15, an insulating region 18, a drain electrode 20, a source electrode 21 and so on) may be appropriately chosen. The accompanying claims and their equivalents are intended to cover such forms or modifications as would fall within the scope and spirit of the present disclosure. The respective embodiments may be implemented in combination with each other.

What is claimed is:

1. A semiconductor device, comprising:
a first semiconductor region of a first conductivity type having a first surface;
a first gate insulating region;
a first gate electrode provided on the first semiconductor region via the first gate insulating region;
a second gate insulating region;
a second gate electrode provided on the first semiconductor region via the second gate insulating region, the second gate electrode being disposed apart from the first gate electrode in a first direction;
a second semiconductor region of a second conductivity type provided on the first semiconductor region on a second surface opposite to the first surface and between the first gate electrode and the second gate electrode;
at least one third semiconductor region of the first conductivity type provided on a portion of the second semiconductor region;
a fourth semiconductor region of the second conductivity type provided on another portion of the second semiconductor region, the fourth semiconductor region having an impurity concentration of the second conductivity type higher than an impurity concentration of the second semiconductor region;
a metal region provided on the fourth semiconductor region;
at least one insulating region provided between the at least one third semiconductor region and the metal region;
a first electrode provided on the at least one third semiconductor region, the metal region and the at least one insulating region, the first electrode being electrically connected to the at least one third semiconductor region, the metal region and the at least one insulating region; and
a second electrode provided on the first surface,
wherein a top surface of the at least one insulating region, a top surface of the at least one third semiconductor region and a top surface of the metal region are coplanar with each other.

2. The semiconductor device according to claim 1,
wherein the at least one insulating region is provided annularly around the metal region;
the metal region and the at least one insulating region are surrounded by the at least one third semiconductor region.

3. The semiconductor device according to claim 1,
wherein the at least one third semiconductor region is formed in plurality and provided between the first gate electrode and the second gate electrode;
the at least one insulating region is formed in plurality and provided between the first gate electrode and the second gate electrode;
the plurality of insulating regions are provided between the plurality of third semiconductor regions in the first direction;
the metal region is provided between the plurality of insulating regions in the first direction.

4. The semiconductor device according to claim 1,
wherein the at least one third semiconductor region, the metal region and the at least one insulating region are parallel with each other in a second direction intersecting the first direction;
the metal region and the at least one insulating region are in contact with the first gate electrode and the second gate electrode.

* * * * *